United States Patent
Kim et al.

(10) Patent No.: US 9,735,390 B2
(45) Date of Patent: Aug. 15, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Hyojin Kim, Yongin (KR); Deukjong Kim, Yongin (KR); Yongho Yang, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 2 days.

(21) Appl. No.: 14/817,764

(22) Filed: Aug. 4, 2015

(65) Prior Publication Data
US 2016/0141547 A1 May 19, 2016

(30) Foreign Application Priority Data
Nov. 18, 2014 (KR) .................. 10-2014-0160870

(51) Int. Cl.
*H01L 51/52* (2006.01)
(52) U.S. Cl.
CPC ................. *H01L 51/5246* (2013.01)
(58) Field of Classification Search
None
See application file for complete search history.

(56) References Cited

U.S. PATENT DOCUMENTS

| 9,048,350 | B2* | 6/2015 | Nishido | H01L 33/0095 |
| 9,257,668 | B2* | 2/2016 | Choi | H01L 51/5246 |
| 2007/0046178 | A1* | 3/2007 | Imai | H01L 27/3258 313/504 |
| 2010/0079065 | A1* | 4/2010 | Kamiura | H01L 51/5246 313/504 |
| 2011/0127548 | A1 | 6/2011 | Lee | |
| 2013/0026505 | A1 | 1/2013 | Lee et al. | |
| 2013/0049062 | A1* | 2/2013 | Hatano | H01L 21/50 257/99 |
| 2013/0292666 | A1 | 11/2013 | Sonoda et al. | |
| 2015/0131017 | A1 | 5/2015 | Ro et al. | |
| 2015/0207099 | A1* | 7/2015 | Kao | H01L 51/5237 257/40 |

FOREIGN PATENT DOCUMENTS

| JP | 5313406 B2 | 7/2013 |
| KR | 0949479 B1 | 3/2010 |
| KR | 2011-0059964 A | 6/2011 |
| KR | 2013-0014367 A | 2/2013 |
| KR | 2015-0055436 A | 5/2015 |

* cited by examiner

*Primary Examiner* — Lex Malsawma
(74) *Attorney, Agent, or Firm* — Lee & Morse, P.C.

(57) ABSTRACT

An organic light-emitting display apparatus and a method of manufacturing the same, the organic light-emitting display apparatus including a first substrate that includes a display area and a peripheral area; a second substrate that faces the first substrate; a first metal layer in the peripheral area of the first substrate, the first metal layer including a plurality of holes; and a sealing member that bonds the first substrate to the second substrate, wherein at least one of the plurality of holes includes a region that does not overlap the sealing member.

20 Claims, 11 Drawing Sheets

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2014-0160870, filed on Nov. 18, 2014, in the Korean Intellectual Property Office, and entitled: "Organic Light-Emitting Display Apparatus and Method of Manufacturing the Same," is incorporated by reference herein in its entirety.

BACKGROUND

1. Field

Embodiments relate to an organic light-emitting display apparatus and a method of manufacturing the same.

2. Description of the Related Art

Display apparatuses are apparatuses that are used to provide a user with visual information such as an image or a picture. The display apparatuses may be manufactured in various types for expressing visual information such as an image or a picture.

For example, organic light-emitting display apparatuses are self-emitting display apparatuses that electrically excite an organic compound to emit light. The organic light-emitting display apparatuses may be driven with a low voltage, may be easily thinned, and may have broad viewing angles and fast response times. Therefore, the organic light-emitting display apparatuses are attracting much attention as next-generation display apparatuses instead of liquid crystal display (LCD) devices.

SUMMARY

Embodiments are directed to an organic light-emitting display apparatus and a method of manufacturing the same.

The embodiments may be realized by providing an organic light-emitting display apparatus including a first substrate that includes a display area and a peripheral area; a second substrate that faces the first substrate; a first metal layer in the peripheral area of the first substrate, the first metal layer including a plurality of holes; and a sealing member that bonds the first substrate to the second substrate, wherein at least one of the plurality of holes includes a region that does not overlap the sealing member.

A longest dimension of at least one of the plurality of holes may be greater than a width of the sealing member.

The plurality of holes may be spaced apart from each other in a length direction of the sealing member.

At least some of holes that are arranged adjacent to each other in the length direction of the sealing member among the plurality of holes may overlap each other.

At least one hole of the plurality of holes may have a polygonal shape, a circular shape, or an elliptical shape.

The holes of the plurality of holes may be two-dimensionally arranged.

Holes that are arranged adjacent to each other in a first direction among the plurality of holes may be cornerwise arranged.

Partial regions of the holes that are arranged adjacent to each other in the first direction among the plurality of holes may overlap each other in the first direction, and the other partial regions may not overlap each other in the first direction.

The first direction may be a length direction of the sealing member.

Some of the plurality of holes may not overlap the sealing member.

The display area may include a transistor, and the first metal layer may be formed of a same material as a material as an electrode of the transistor.

The first metal layer may be formed of the same material as a material of at least one of a source electrode and a drain electrode of the transistor.

The organic light-emitting display apparatus may further include a first insulating layer between the first substrate and the first metal layer.

The first insulating layer may be formed of a same material as a material of an interlayer insulating layer in the display area.

The organic light-emitting display apparatus may further include second and third metal layers between the first substrate and the first insulating layer, the second metal layer and the third metal layer being spaced apart from each other.

The organic light-emitting display apparatus may further include a second insulating layer on the first substrate, the second insulating layer covering the second metal layer, wherein the first insulating layer is on the second insulating layer and covers the third metal layer.

A distance between the second metal layer and the third metal layer may be less than a longest dimension of at least one of the plurality of holes.

The second metal layer and the third metal layer may be on different layers.

The embodiments may be realized by providing a method of manufacturing an organic light-emitting display apparatus, the method including providing a first substrate that includes a display area and a peripheral area surrounding the display area; sequentially forming an insulating layer and a metal layer in the peripheral area; forming a hole in the metal layer; and bonding the first substrate to a second substrate that corresponds to the first substrate with a sealing member that fills the hole, wherein a portion of the hole in the metal layer does not overlap a width of the sealing member.

A longest dimension of the hole may be greater than the width of the sealing member.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Terms like "first" and "second" may be used to describe various elements, but the elements should not be limited by the terms. The terms may be used only as object for distinguishing an element from another element.

The terms used in this application, only certain embodiments have been used to describe, is not intended to limit the present embodiments. In the following description, the technical terms are used only for explain a specific exemplary embodiment while not limiting the present embodiments. The terms of a singular form may include plural forms unless referred to the contrary. The meaning of "include", "comprise", "including", or "comprising" specifies a property, a region, a fixed number, a step, a process, an element and/or a component but does not exclude other properties, regions, fixed numbers, steps, processes, elements and/or components.

In the following embodiments, when an element such as a layer or a region is referred to as being "on" another element, this includes a case where one element is disposed between other elements, in addition to a case where one element is disposed directly on the other element.

Figure 1:
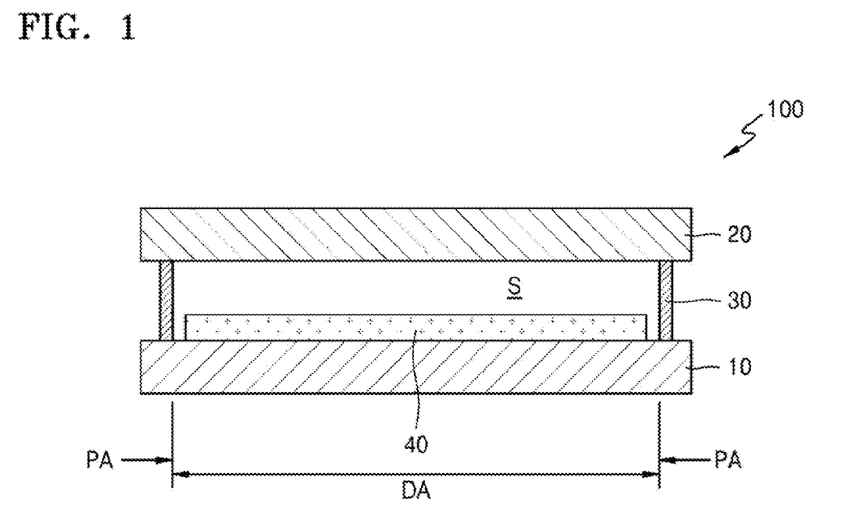
FIG. 1 illustrates a diagram schematically showing an organic light-emitting display apparatus according to an exemplary embodiment.
Figure 2:
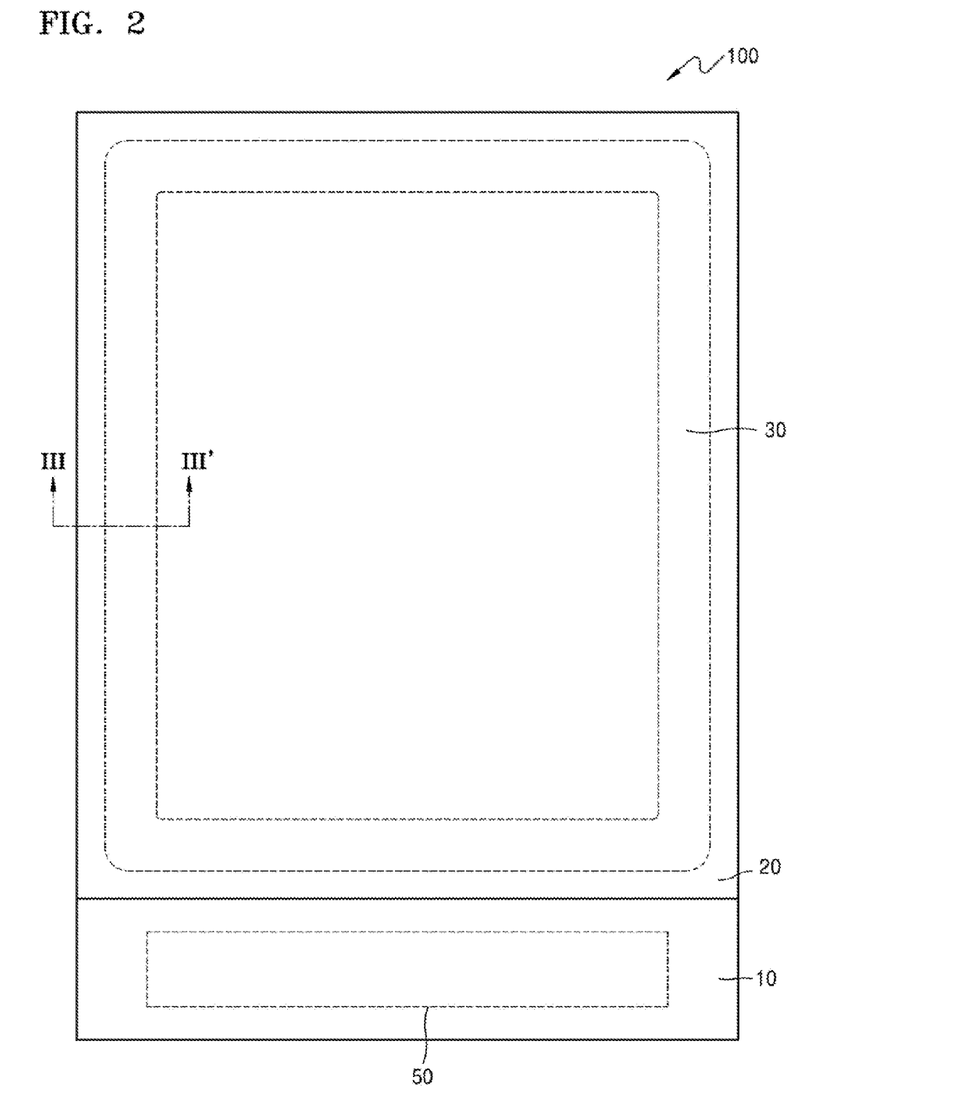
FIG. 2 illustrates a plan view schematically showing the organic light-emitting display apparatus of FIG. 1.

FIG. 1 illustrates a diagram schematically showing an organic light-emitting display apparatus 100 according to an exemplary embodiment. FIG. 2 illustrates a plan view schematically showing the organic light-emitting display apparatus 100 of FIG. 1.

Referring to FIGS. 1 and 2, the organic light-emitting display apparatus 100 may include a first substrate 10 (having a display area DA), a second substrate 20 (that faces the first substrate 10), and a sealing member 30 (that surrounds the display area DA and bonds the first substrate 10 to the second substrate 20).

The first substrate 10 may be divided into or include the display area DA and a peripheral area PA that surrounds the display area DA. For example, the organic light-emitting display apparatus 100 may be divided into or include the peripheral area PA and the display area DA. The first substrate 10 may be formed of, e.g., a transparent glass material of which a main component is $SiO_2$. In an implementation, the first substrate 10 may be formed of, e.g., a transparent plastic material. The first substrate 10 may be, e.g., a flexible substrate having flexibility. In comparison with a glass substrate, a flexible substrate may be light because its weight is small, and may not break easily. In an implementation, the first substrate 10 may be formed of a material having flexible characteristics, e.g., a polymer material such as a flexible plastic film.

The display area DA of the first substrate 10 may include a plurality of transistors (Ta and Tb) that are driving thin film transistors (TFTs), a capacitor (Cst), and an organic light-emitting device (OLED) which are formed on the first substrate 10. The display area DA will be described below in greater detail.

The second substrate 20 may correspond to the first substrate 10 and may be formed of various materials, e.g., a glass material, a metal material, or a plastic material. In an implementation, a functional layer that performs various functions may be formed on the second substrate 20. For example, the functional layer may include at least one of a polarizer, a touch screen, and a cover window.

The touch screen may have a structure in which a touch screen pattern is directly formed on the second substrate 20, e.g., may be an on-cell touch screen panel. The polarizer may help reduce and/or prevent external light from being reflected from the display area DA. The cover window may protect the organic light-emitting display apparatus 100.

The first substrate 10 may be bonded to the second substrate 20 by the sealing member 30. The sealing member 30 may be disposed in or on the peripheral area PA to surround the display area DA of the first substrate 10. The sealing member 30 may seal the display area DA, thereby protecting the display area DA from the outside. In an implementation, a moisture absorbent and/or a filler may be disposed in an internal space S, which is sealed by the first substrate 10, the second substrate 20, and the sealing member 30.

An integrated circuit (IC) 50 may be mounted on one edge of the first substrate 10, e.g., an edge that is not covered by or aligned with the second substrate 20. A metal line that connects the IC 50 to the display area DA may be disposed between the first substrate 10 and the sealing member 30.

The sealing member 30 may be formed of or include, e.g., a material which is melted by thermal energy applied thereto. The sealing member 30 may be or include, e.g., a material that is hardened by light. For example, the sealing member 30 may include glass frit.

To bond the first substrate 10 to the second substrate 20 with the sealing member 30, the sealing member 30 may be hardened by, e.g., irradiating ultraviolet (UV) light or laser light. For example, the UV light or the laser light may pass through the second substrate 20 and may be irradiated onto the sealing member 30. When a metal material is disposed under the sealing member 30, the UV light or the laser light passing through the sealing member 30 may be reflected from the metal material and may again be transferred to the sealing member 30, thereby increasing an irradiation efficiency of the UV light or the laser light.

However, in addition to a material of the sealing member 30, a material (e.g., metal) between the sealing member 30 and the second substrate 20 may be melted by light. Therefore, the melted material could be moved along a traveling direction of the light and may accumulate at a point where irradiation of the light is ended. The accumulated material could cause the sealing member 30 to partially detach.

The organic light-emitting display apparatus 100 according to an exemplary embodiment may include a hole (h) that does not overlap a width (W) of the sealing member 30, and thus, a melted material may disperse and/or accumulate away from the sealing member 30. Therefore, partial detachment may be reduced and/or prevented. For example, rather than accumulating at a point where irradiation of light ends, the melted material may be regularly dispersed away from the sealing member due to positions of the holes, and thus the material may not accumulate in an amount or in a location that becomes detrimental to the attachment of the sealing member. For example, the holes may direct the melted material away from the sealing member (e.g., at sides of the sealing member).

Figure 3:
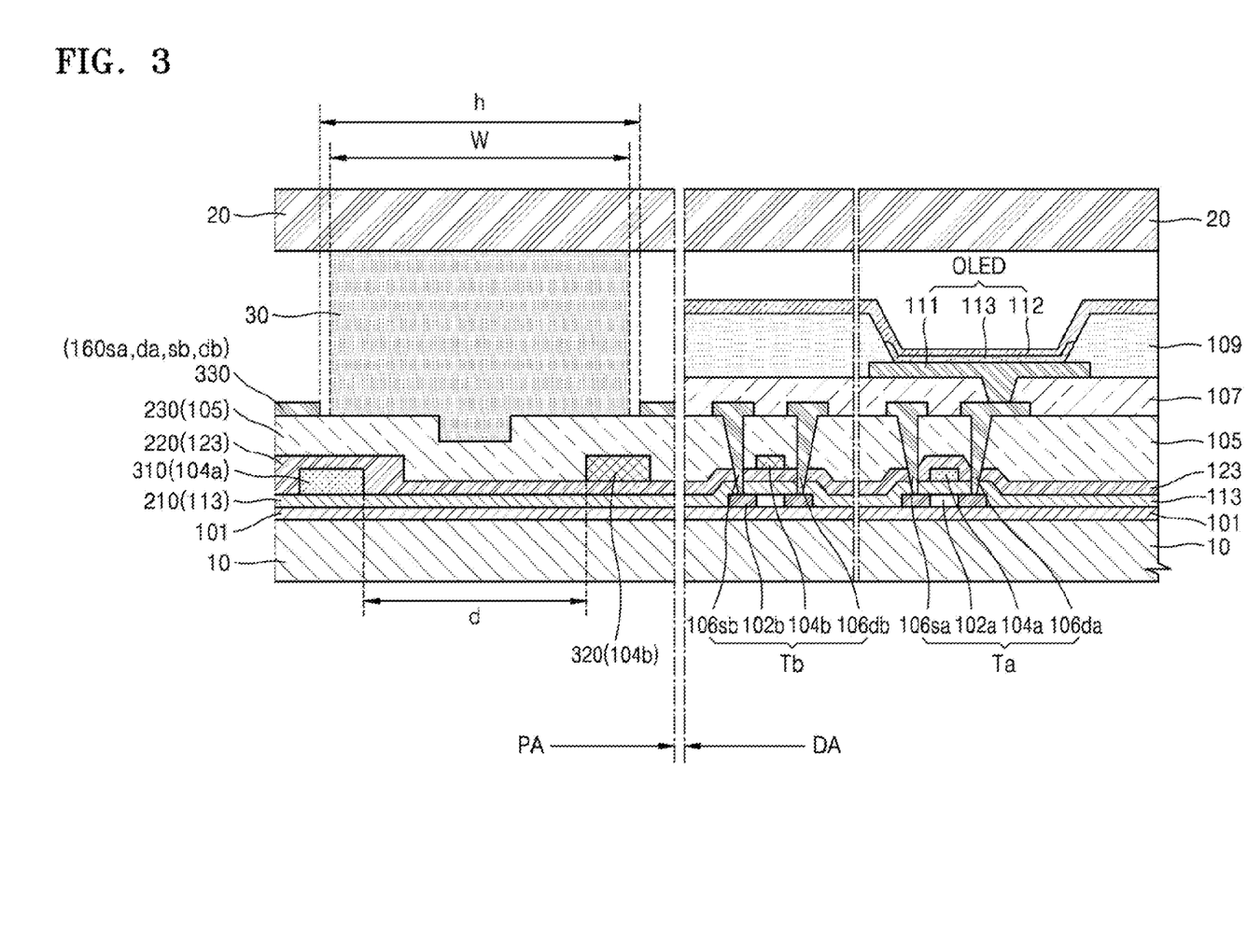
FIG. 3 illustrates a cross-sectional view of a portion of a sealing member and a display area of FIG. 1.
Figure 4:
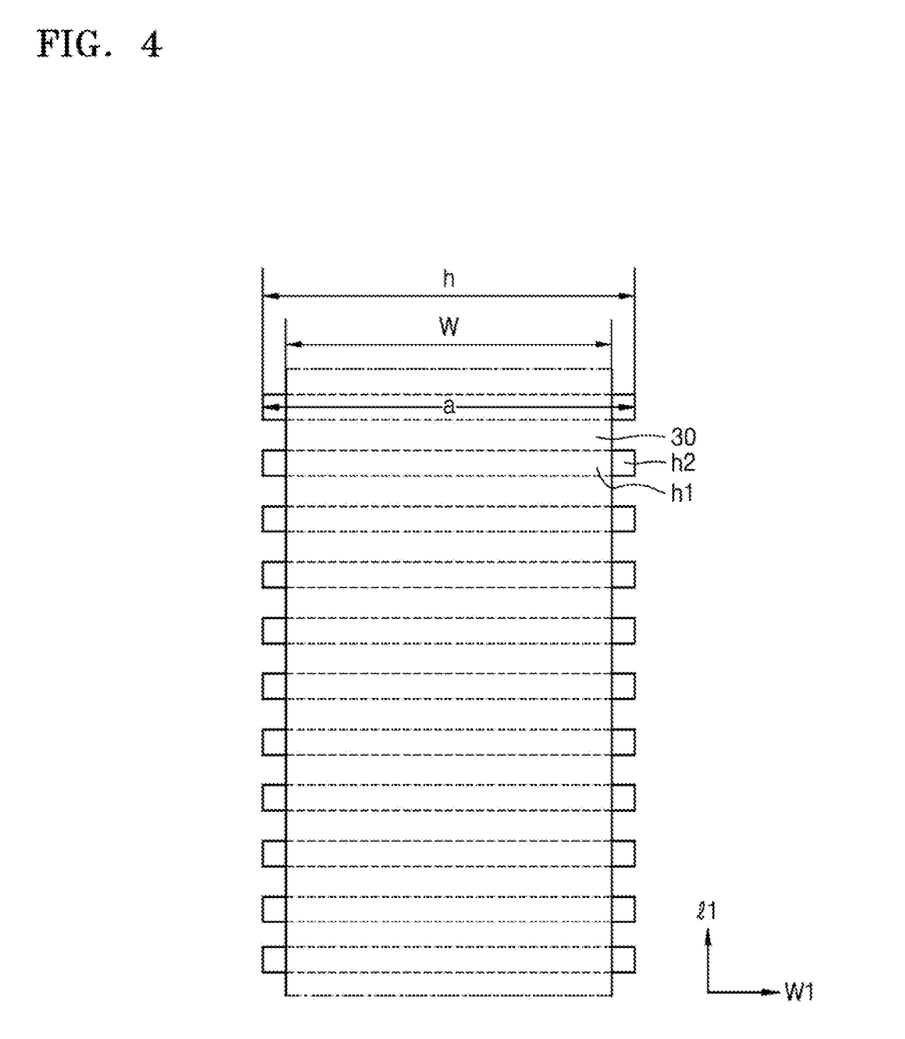
FIG. 4 illustrates a schematic plan view of the sealing member and hole of FIG. 3.

FIG. 3 illustrates a cross-sectional view of a portion of the sealing member 30 and the display area DA of FIG. 1. FIG. 4 illustrates a schematic plan view of the sealing member 30 of FIG. 3.

Referring to FIG. 3, a buffer layer 101 may be further formed on the substrate 10. The buffer layer 101 may be formed of an inorganic material, e.g., SiOx, SiNx, SiON, AlO, or AlON, or an organic material, e.g., acryl or polyimide, or the inorganic material and the organic material may be alternately stacked. The buffer layer 101 may help prevent penetration of oxygen and moisture and prevents dispersion of impurities or moisture that comes from or passes through the substrate 10. In an implementation, the buffer layer 101 may help adjust a heat transfer speed in crystallization, and thus, a semiconductor may be well crystallized.

The display area DA of the first substrate 10 may include a pixel that includes a circuit and an organic light-emitting device. Only one pixel is illustrated in FIG. 3, for convenience of description. The display area DA may include a plurality of pixels. Also, FIG. 3 illustrates two TFTs and the organic light-emitting device included in the pixel. In an implementation, the pixel may further include an additional TFT and a capacitor, in addition to the illustrated elements.

A pixel circuit, which includes a plurality of TFTs, e.g., first and second TFTs Ta and Tb, and a capacitor (not shown), and an organic light-emitting device OLED connected to the pixel circuit may be formed on the buffer layer 101. The first TFT Ta may include an active layer 102a, a first gate electrode 104a, a source electrode 106sa, and a drain electrode 106da, and the second TFT Tb includes an active layer 102b, a gate electrode 104b, a source electrode 106sb, and a drain electrode 106db. In the two TFTs, namely, the first and second TFTs Ta and Tb, the gate electrodes 104a and 104b may be formed on different layers.

For example, in the first TFT Ta, the active layer 102a, which may be formed in a certain pattern, may be disposed on a top surface of the buffer layer 101. The active layer 102a may include an inorganic semiconductor material, e.g., silicon, an organic semiconductor material, or an oxide semiconductor material, and may be formed by injecting a p-type or n-type dopant thereto. A first gate insulating layer 113 may be formed on the active layer 102a. The first gate electrode 104a may be formed on the first gate insulating layer 113 in correspondence with the active layer 102a. A second gate insulating layer 123 and an interlayer insulating layer 105 may be formed to cover the first gate electrode 104a, and the source electrode 106sa and the drain electrode 106da may be formed on the interlayer insulating layer 105 to contact a certain region of the active layer 102a.

In the second TFT Tb, the active layer 102b, which may be formed in a certain pattern, may be disposed on the top surface of the buffer layer 101, and the first gate insulating layer 113 and a second gate insulating layer 123 may be formed on the active layer 102b. The second gate electrode 104b may be formed on the second gate insulating layer 123 in correspondence with the active layer 102b. The interlayer insulating layer 105 may be formed to cover the second gate electrode 104b, and the source electrode 106sb and the drain electrode 106db may be formed on the interlayer insulating layer 105 to contact the active layer 102b.

Here, the interlayer insulating layer 105 may be formed as a single layer or layers formed of an inorganic material such as oxide silicon or nitride silicon. A thickness d3 of the interlayer insulating layer 105 may be greater than a thickness d1 of the first gate insulating layer 113 or a thickness d2 of the second gate insulating layer 123, and a surface may be planarized, thereby helping to reduce the possibility of and/or prevent a parasitic capacitance from being generated between the source/drain electrodes 106sa and 106sb/106da and 106db and a lower conductive layer.

As described above, in the TFTs, e.g., the first and second TFTs Ta and Tb, a thickness of a gate insulating layer between the first gate electrode 104a and the active layer 102a may differ from a thickness of a gate insulating layer between the second gate electrode 104b and the active layer 102b. Thus, the following effects may be obtained. First, when a TFT used as a driving TFT is formed to have a thick gate insulating layer, a driving range of a gate voltage may be broadened, and by changing a level of a gate voltage applied to a gate electrode of the driving TFT, light emitted from the organic light-emitting device may be controlled to have an ample gray scale. Also, a TFT used as a switching TFT may be formed to have a thin gate insulating layer and thus may be turned on/off at a high speed, thereby decreasing a parasitic capacitance, which may be generated between a gate electrode and an active layer. Therefore, a pixel circuit structure that is optimal for the organic light-emitting display apparatus may be implemented.

A passivation layer 107 may be formed to cover the source electrode 106sa and drain electrode 106da of the first TFT Ta and the source electrode 106sb and drain electrode 106db of the second TFT Tb. A separate insulating layer may be further formed on the passivation layer 107, for planarization.

The organic light-emitting device OLED may be formed on the passivation layer 107. The organic light-emitting device OLED may include a first electrode 111, a second electrode 112, and an intermediate layer 114.

The first electrode 111 may be formed on the passivation layer 107. The first electrode 111 may be electrically connected to one of the source electrode 106sa, the drain electrode 106da, the source electrode 106sb, and the drain electrode 106db. Also, a pixel-defining layer 109 may be formed to cover part of the first electrode 111. An opening may be formed in the pixel-defining layer 109, and then, the intermediate layer 114 including an organic emission layer may be formed in a region defined by the opening. The second electrode 112 may be formed on the intermediate layer 114.

An image may not be displayed in or at the peripheral area PA of the first substrate 10, and various members for driving and other modules may be disposed in the display area DA. The buffer layer 101 and a first insulating layer 210 may be sequentially disposed on the first substrate 10 in the peripheral area PA. Also, a first metal layer 310 may be disposed on the first insulating layer 210, and a second insulating layer 220 may be disposed on the first insulating layer 210 and may cover the first metal layer 310. The second insulating layer 220 may insulate the first metal layer 310 from a second metal layer 320 by, and the first metal layer 310 may be separate from the second metal layer 320. In an implementation, the first metal layer 310 and the second metal layer 320 may be disposed not to overlap each other in a height direction of the organic light-emitting display apparatus, e.g., in a direction orthogonal to inwardly facing surfaces of the first substrate 10 and/or second substrate 20. In an implementation, a third insulating layer 230 may be disposed on the second insulating layer 220 and may cover the second metal layer 320, and a third metal layer 330 may be disposed on the third insulating layer 230. The third metal layer 330 may include a plurality of holes h. The sealing member 30 may fill the plurality of holes h and may bond the first substrate 10 to the second substrate 20. In an implementation, a distance d between the first metal layer 310 and the second metal layer 320 may be less than a longest length or dimension of the hole h, which is formed in the third metal layer 330.

The first and second insulating layers 210 and 220 in the peripheral area PA may be formed of a same material as that of the first and second gate insulating layers 113 and 124 in the display area DA, respectively. In an implementation, the first and second metal layers 310 and 320 in the peripheral area PA may be formed of a same material as that of the first and second gate electrodes 104a and 104b in the display area DA, respectively, and may be formed on the same layer. In an implementation, the third insulating layer 230 in the peripheral area PA may be formed of a same material as that of the interlayer insulating layer 105 in the display area DA, and the third metal layer 330 in the peripheral area PA may be formed of a same material as that of the source electrode 106sa, the drain electrode 106da, the source electrode 106sb, and the drain electrode 106db in the display area DA.

The holes h according to an exemplary embodiment may not overlap a width W of the sealing member 30. For example, the holes h may have a width that is wider than a width W of the sealing member 30. As illustrated in FIG. 4, the holes h according to an exemplary embodiment may be arranged to be separate or spaced apart from each other in a length direction l1 (in FIG. 4) of the sealing member 30. The holes h may have a tetragonal shape. A longest length or dimension a of the hole h may be greater than the width W of the sealing member 30. Therefore, a partial region h1 of the hole h may overlap the sealing member 30, and another partial region h2 may not overlap the sealing member 30, e.g., in the direction orthogonal to the inwardly facing surfaces of the first substrate 10 and/or second substrate 20. For example, a central region of the hole h may overlap the sealing member 30, and an edge region of the hole may not overlap the sealing member 30.

The hole h may be provided in plurality, and the plurality of holes h may be one-dimensionally arranged. For example, the holes h may be repeatedly arranged to be separate or spaced apart from each other in or along the length direction l1 of the sealing member 30. Light may be irradiated in the length direction l1 of the sealing member 30, e.g., a laser may move along the length direction l1 as light is irradiated to the sealing member 30. A melted material may move in the length direction l1 of the sealing member 30 and may accumulate in the hole h. In an implementation, the light may be irradiated in a width direction W1 of the sealing member 30. The melted material may move in the width direction W1 of the sealing member 30 and may accumulate in the hole h. The melted material may be accumulated in the hole h, and the melted material may be prevented from thickly accumulating (e.g., at any one portion of the apparatus). Therefore, the partial detachment of the sealing member 30 may be reduced and/or prevented.

Figure 5:
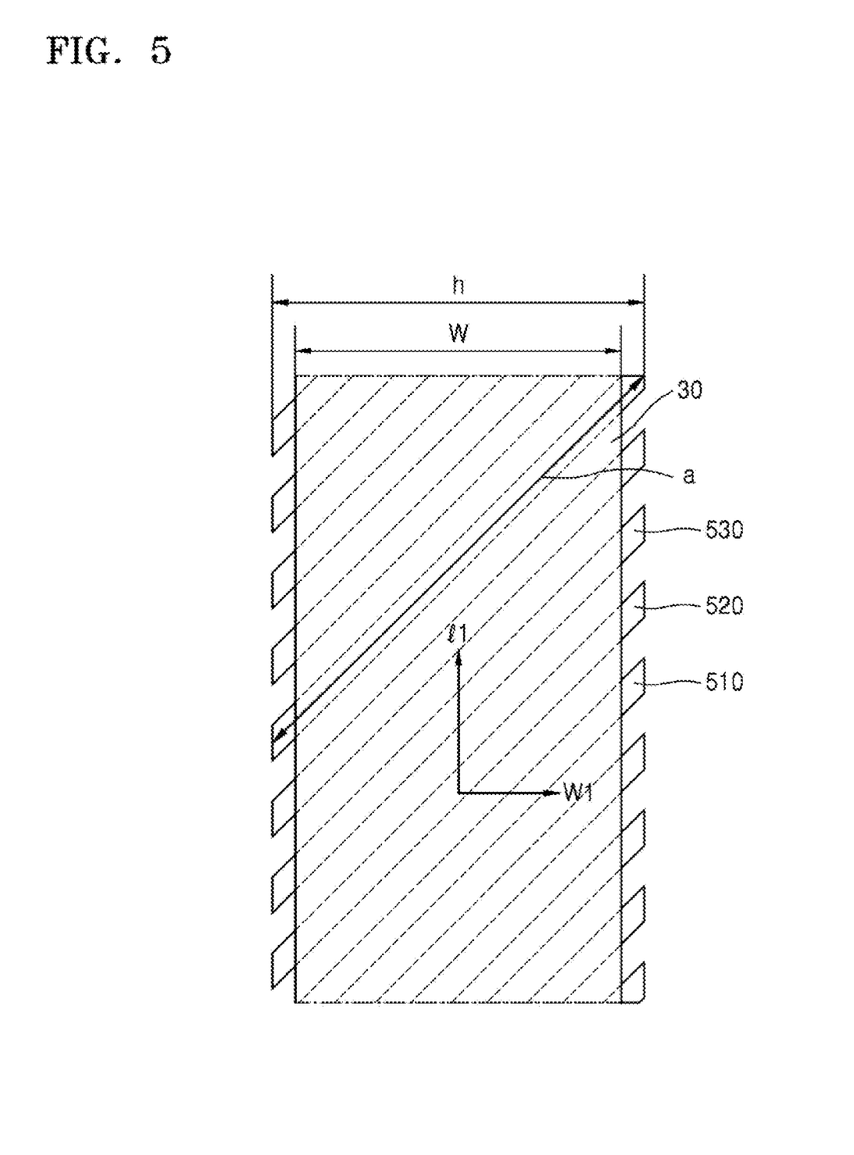
FIG. 5 illustrates a plan view of a sealing member and hole according to another exemplary embodiment.
Figure 6A:
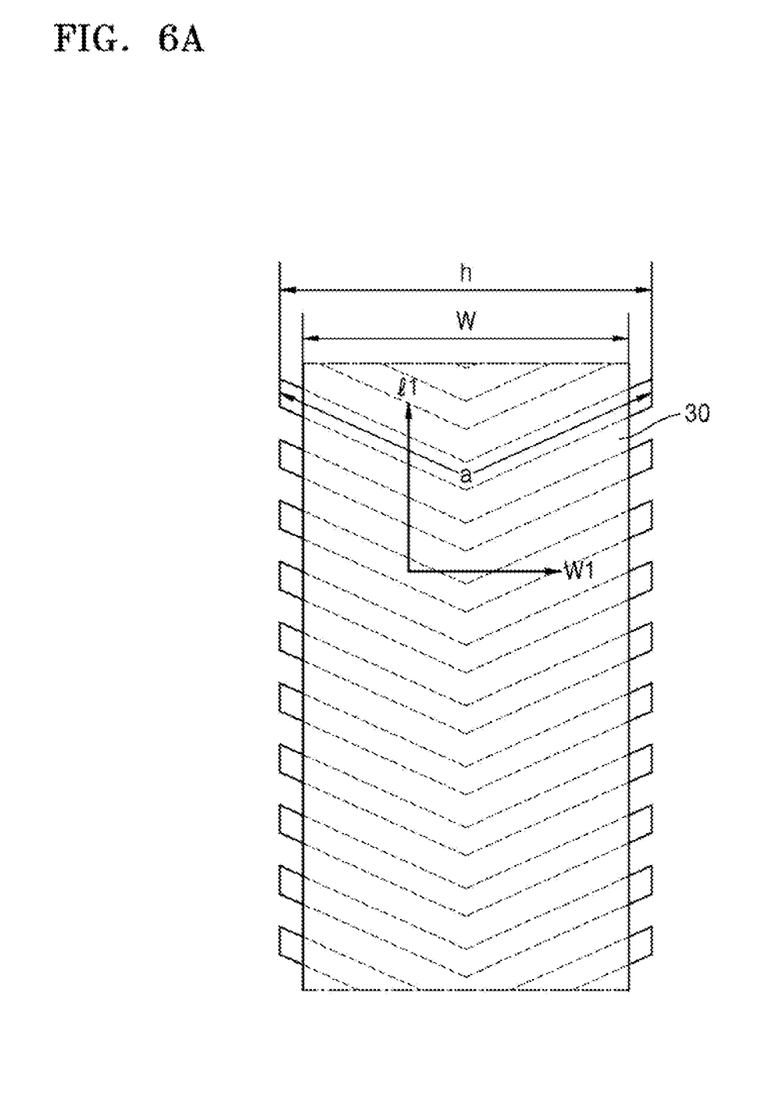
FIGS. 6A and 6B illustrate plan views of a sealing member and hole according to other exemplary embodiments.
Figure 6B:
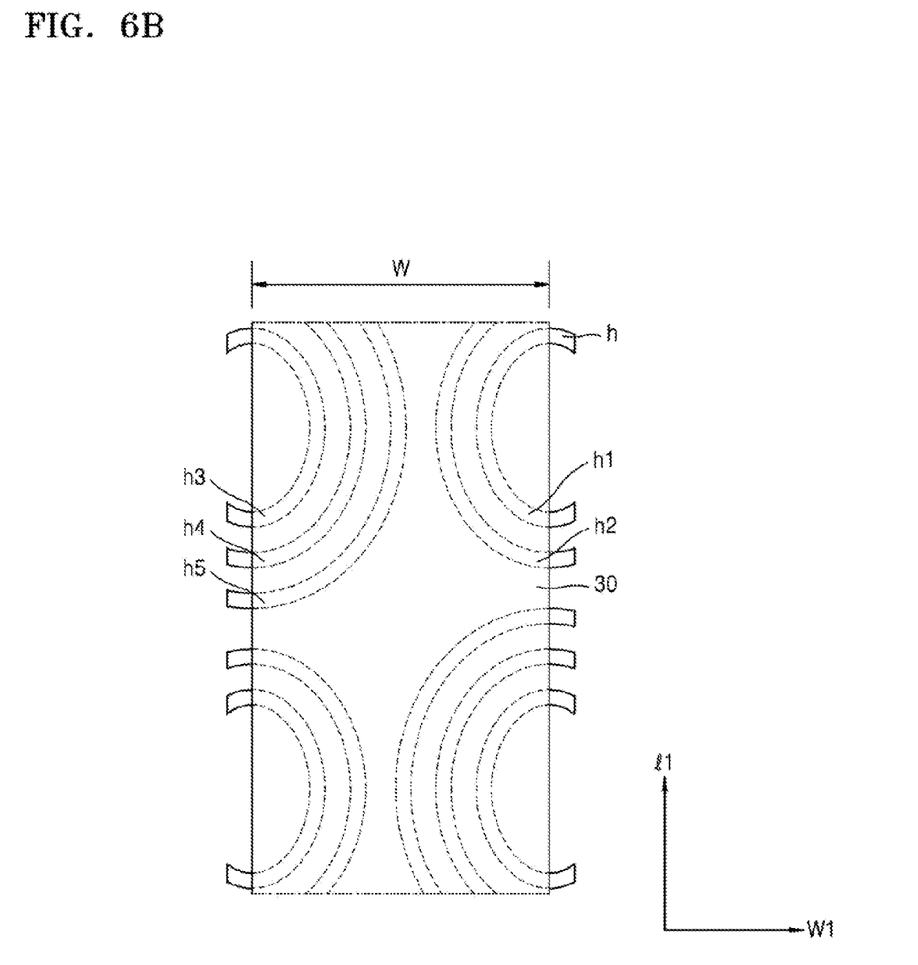

FIG. 5 illustrates a plan view of a sealing member and hole according to another exemplary embodiment. FIGS. 6A and 6B illustrate plan views of a sealing member and hole according to other exemplary embodiments. As illustrated in FIGS. 5 and 6A, a plurality of holes h may be arranged to be separate or spaced apart from each other in the length direction l1 of the sealing member 30. A longest length or dimension a of the hole h may be greater than the width W of the sealing member 30. Therefore, a partial region or portion of the hole h may overlap the sealing member 30, and another partial region or portion of the hole h may not overlap the sealing member 30. For example, a central region of the hole h may overlap the sealing member 30, and an edge region may not overlap the sealing member 30. In an implementation, at least some holes (which are arranged adjacent to each other in the length direction of the sealing member 30 among the plurality of holes h) may overlap each other.

A hole h illustrated in FIG. 5 may have a parallelogram shape. A direction of a longest length a of the hole h may differ from at least one of the width direction W1 of the sealing member 30 and the length direction l1 of the sealing member 30. Therefore, at least partial regions of holes 510 and 520 (which are arranged adjacent to each other among a plurality of the holes h) may be disposed or aligned on or along a same line as the width direction W1 of the sealing member 30. Also, at least partial regions of the hole 520 and a hole 530, which are arranged adjacent to each other, among the plurality of holes h may be disposed or aligned on or along the same line as the length direction l1 of the sealing member 30.

In an implementation, a hole h may have a zigzag shape that is bent at least one time, e.g., as illustrated in FIG. 6A. A direction of a longest length or path a of the hole h may differ from the width direction W1 of the sealing member 30 and the length direction l1 of the sealing member 30.

The hole h illustrated in FIGS. 5 and 6A may help reduce a moving distance of a melted material, in comparison with the hole h illustrated in FIG. 4. The moving distance of the melted material may be reduced, and an amount of the melted material accumulated in the hole h may be reduced. Therefore, the partial detachment of the sealing member 30 may be reduced. In the drawing, the hole h is illustrated in a polygonal shape, for convenience of description. In an implementation, the hole h may have a circular shape, an elliptical shape, or a polygonal shape such as a tetragonal shape.

In an implementation, as illustrated in FIG. 6B, a hole may be configured by or of a combination of sub-holes h1 and h2, which start from an inner side of the sealing member 30, overlap the sealing member 30, and end at the inner side of the sealing member 30, and sub-holes h3 to h5 which start from an outer side of the sealing member 30, overlap the sealing member 30, and end at the outer side of the sealing member 30. A shape of each of the sub-holes h1 to h5 may be a semicircular shape, an elliptical shape, or a polygonal shape such as a triangular shape.

Figure 7:
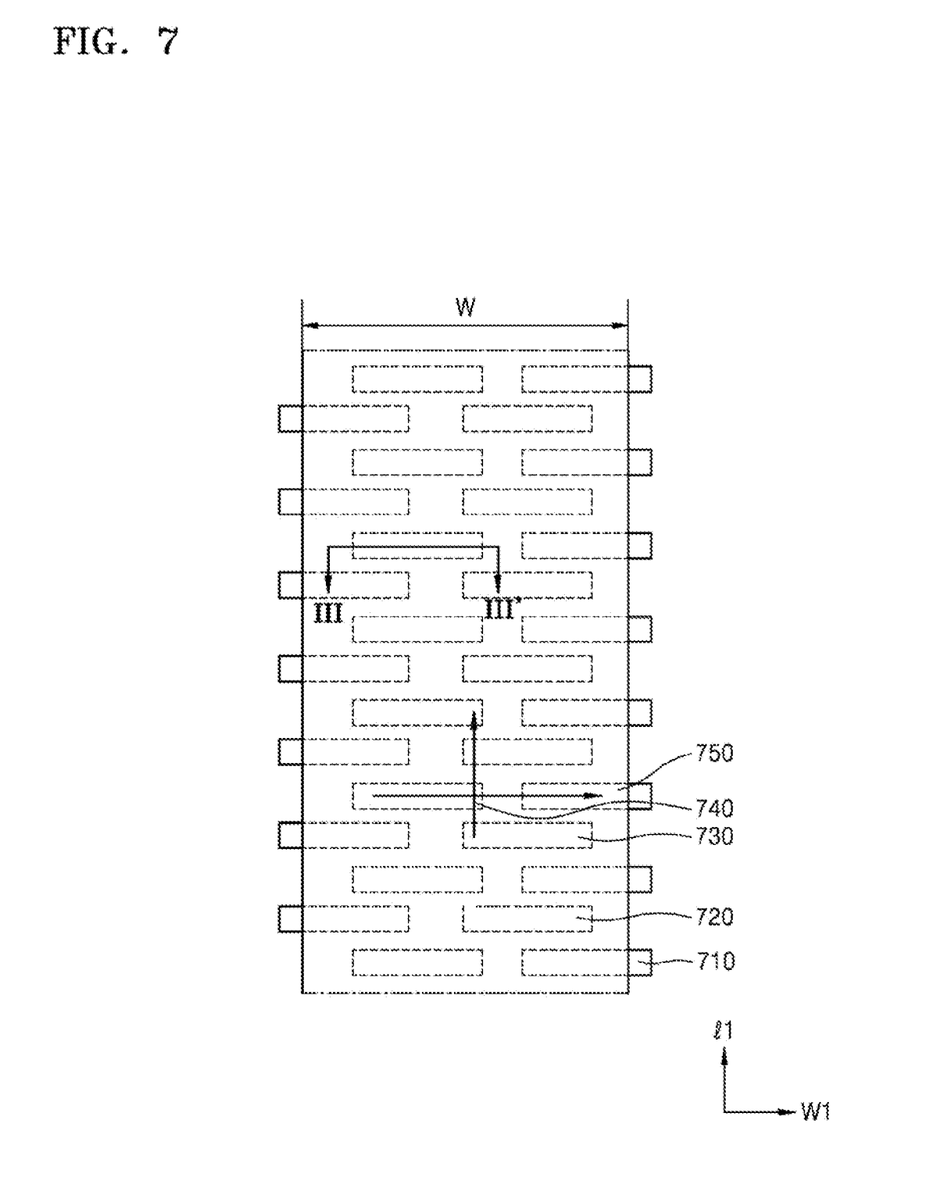
FIG. 7 illustrates a plan view of a portion of a sealing member and hole according to another exemplary embodiment.
Figure 8:
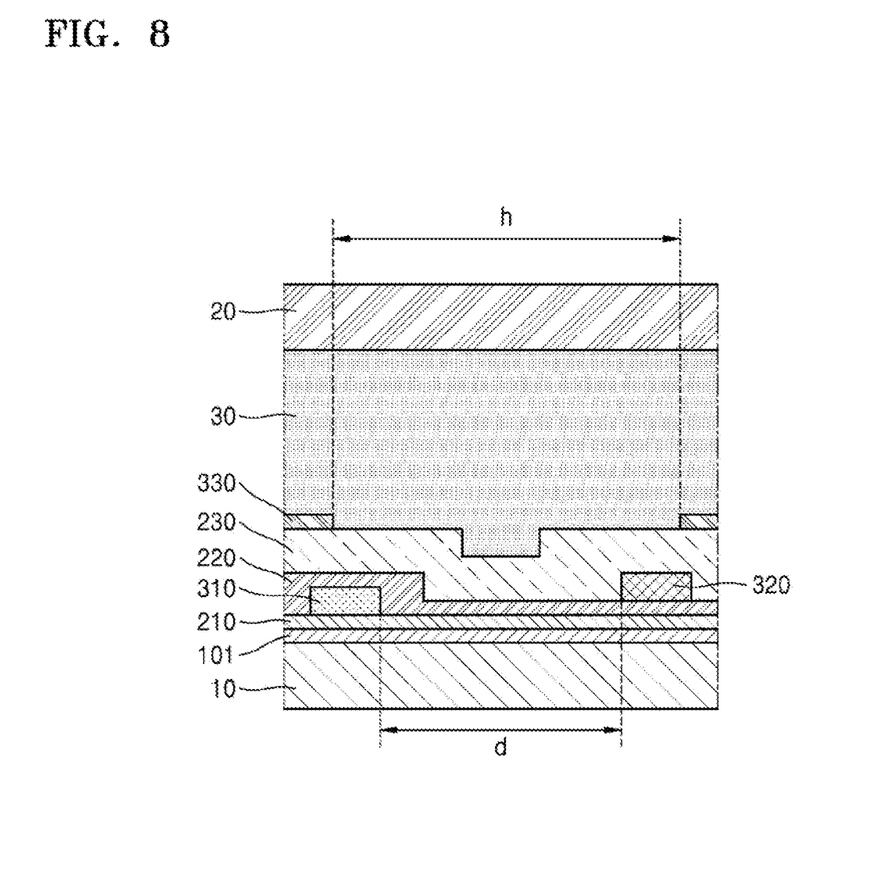
FIG. 8 illustrates a partial cross-sectional view of the sealing member of FIG. 7.

FIG. 7 illustrates a plan view of a portion of a sealing member and hole according to another exemplary embodiment. FIG. 8 illustrates a partial cross-sectional view of the sealing member 30 of FIG. 7. As illustrated in FIGS. 7 and 8, a plurality of holes h may be two-dimensionally arranged in the third metal layer 330. For example, the plurality of holes h may be arranged in an offset pattern. A partial region or portion of a hole 710 (which is located in an edge region of the sealing member 30, among the plurality of holes h) may not overlap or be aligned with the sealing member 30.

In an implementation, a partial region or portion of a hole 720, which is located in a central region of the sealing member 30, among the plurality of holes h may not overlap, e.g., an edge of, the sealing member 30.

The plurality of holes h may be arranged cornerwise with at least one of a length direction l1 and a width direction W1. Partial regions of two holes 730 and 740, which are arranged adjacent to each other in the length direction l1, among the plurality of holes h, may overlap or be aligned with each other in the length direction l1, and another partial region may not overlap or be aligned with each other in the length direction l1. For example, the plurality of holes h may be arranged in an offset pattern. Partial regions of the hole 740 and a hole 750, which are arranged adjacent to each other, in the width direction W1 among the plurality of holes h, may overlap or be aligned with each other. Therefore, although a longest length a of the hole h may be less than a width W of the sealing member 30, the plurality of holes h may accommodate a melted material that moves in the length direction l1 or width direction W1 of the sealing member 30.

Figure 9:
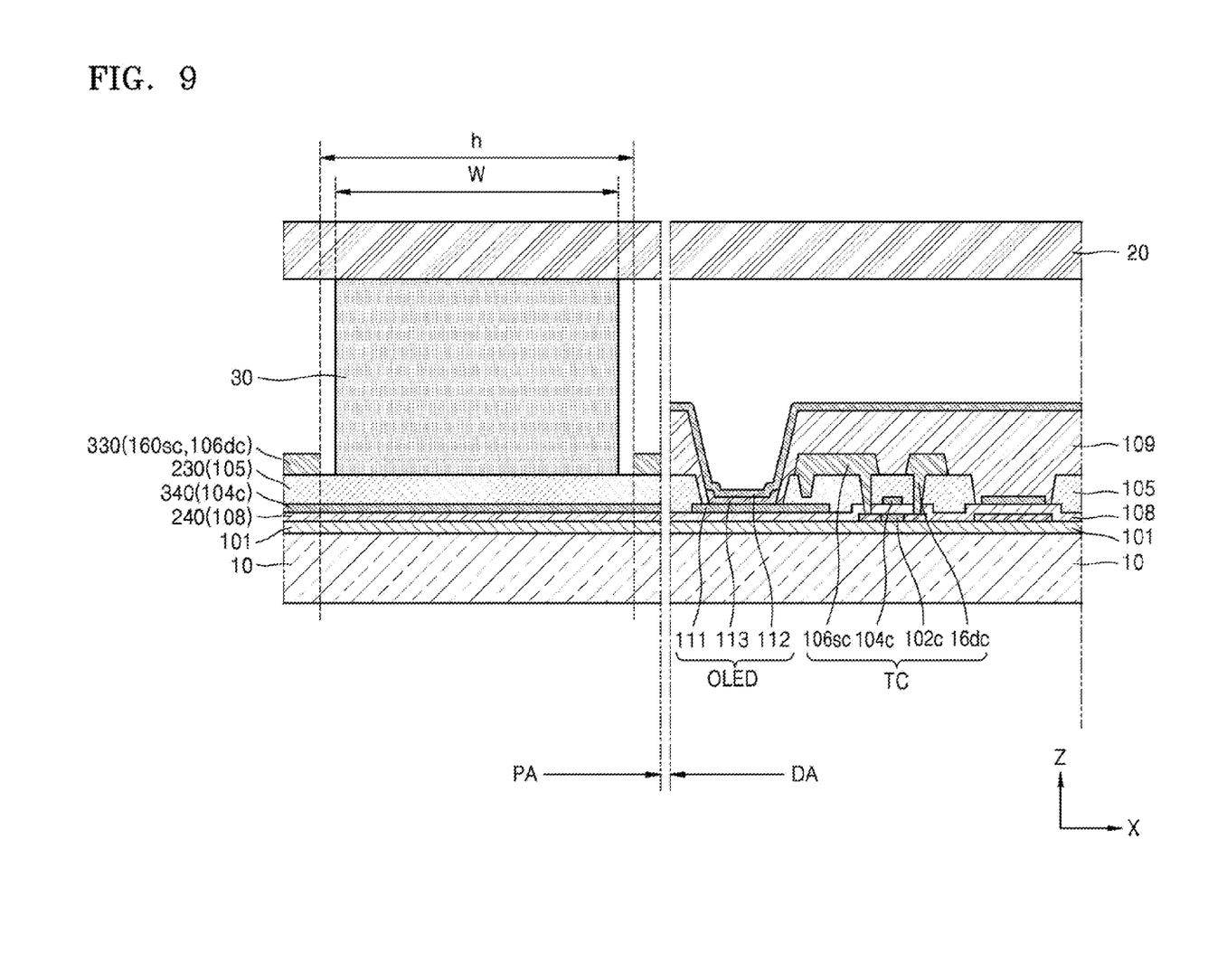
FIG. 9 illustrates a cross-sectional view of an organic light-emitting display apparatus according to another exemplary embodiment.

FIG. 9 illustrates a cross-sectional view of an organic light-emitting display apparatus according to another exemplary embodiment. In comparison with FIG. 3, the organic light-emitting display apparatus of FIG. 9 may include one TFT. Therefore, a buffer layer, a first insulating layer 210, and a first metal layer 310 may be disposed on a substrate in a peripheral area PA, and a third insulating layer 230 may be disposed on the first metal layer 310. For example, in comparison with FIG. 3, the second insulating layer 220 and the second metal layer 320 may be omitted. Also, in FIG. 9, a hole h, which may have a width greater than a width of a sealing member, may be formed in the third metal layer 330, and the sealing member 30 may fill the hole h and bond a first substrate to a second substrate.

Figure 10:
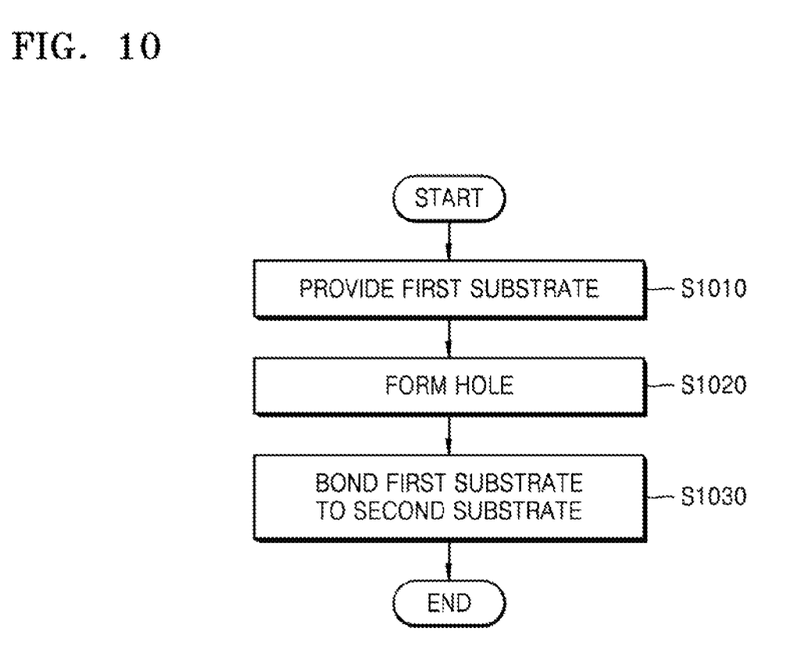
FIG. 10 illustrates a flowchart of a method of manufacturing an organic light-emitting display apparatus, according to an exemplary embodiment.

FIG. 10 illustrates a flowchart of a method of manufacturing an organic light-emitting display apparatus, according to an exemplary embodiment. For example, in the method of manufacturing the organic light-emitting display apparatus, the first substrate 10, which includes the display area DA and the peripheral area PA surrounding the display area DA, may be provided in operation S1010. The first insulating layer 210, the first metal layer 310, the second insulating layer 220, the second metal layer 320, the third insulating layer 230, and the third metal layer 330 may be sequentially formed in the peripheral area PA of the first substrate 10. For example, the buffer layer 101, the first gate insulating layer 113, the first gate electrode 104a, the second gate insulating layer 123, the second gate electrode 104b, the interlayer insulating layer 105, the source electrode 106sa, the drain electrode 106da, the source electrode 106sb, and the drain electrode 106db may be formed on the first substrate 10 over the display area DA and the peripheral area PA, and the organic light-emitting device OLED and the first and second transistors Ta and Tb may be formed in the display area DA. In forming the source electrode 106sa, the drain electrode 106da, the source electrode 106sb, and the drain electrode 106db while forming the first and second transistors Ta and Tb, the method may include an operation of forming the third metal layer 330, which is disposed in the peripheral area PA of the first substrate 10.

In operation S1020, the hole h may be formed in the third metal layer 330.

In operation S1030, the first substrate 10 may be bonded to the second substrate 20 corresponding to the first substrate 10 by using the sealing member 30, which fills the hole h. The sealing member 30 may be formed in the peripheral area PA surrounding the display area DA, and may be formed to fill the hole h. A portion of the hole h formed in the third metal layer 330 may not overlap the width w of the sealing member 30.

The first substrate 110 and the second substrate 220 may be aligned with each other, and when UV light or laser light is irradiated from above the second substrate 120, the sealing member 30 between the first substrate 110 and the second substrate 120 may be hardened. When the UV light or the laser light is irradiated onto the sealing member 30, the third metal layer 330, which is formed on the first substrate 110 to overlap the sealing member 30, reflects the laser light. Therefore, the sealing member 30 may be primarily hardened by the light irradiated from above the second substrate 120 and may be secondarily hardened by the laser light reflected through the third metal layer 330. Accordingly, the sealing member 30 may be solidly hardened. Moreover, even if the third metal layer 300 were to be melted by the irradiation of the light, a melted material may accumulate in the hole h, and the partial detachment of the sealing member 30 may be reduced.

By way of summation and review, in an organic light-emitting display apparatus, a sealing member may be used to bond a lower substrate to an upper substrate. The lower substrate may be bonded to the upper substrate by irradiating a laser onto the sealing member. Metal may be melted by the irradiated laser, moved along a direction of the laser, and may be thickly piled up in a certain region. A thickly piled material may cause partial detachment of the sealing member.

The embodiments may provide an organic light-emitting display apparatus and a method of manufacturing the same, which help reduce the partial detachment of a sealing member.

The embodiments may provide an organic light-emitting display apparatus and a method of manufacturing the same, which help enhance a bonding force of a sealing member.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a first substrate that includes a display area and a peripheral area;
    a second substrate that faces the first substrate;
    a first metal layer in the peripheral area of the first substrate, the first metal layer including a discontinuous plurality of holes that are separate from each other; and
    a sealing member that bonds the first substrate to the second substrate, at least a portion of the first metal layer being between the sealing member and the first substrate,
    wherein at least one of the plurality of holes includes a first region that underlies the sealing member and a second region that extends from the first region and does not overlap the sealing member.

2. The organic light-emitting display apparatus as claimed in claim 1, wherein a longest dimension of at least one of the plurality of holes is greater than a width of the sealing member.

3. The organic light-emitting display apparatus as claimed in claim 1, wherein the plurality of holes are spaced apart from each other in a length direction of the sealing member.

4. The organic light-emitting display apparatus as claimed in claim 3, wherein at least some of holes that are arranged adjacent to each other in the length direction of the sealing member among the plurality of holes are aligned with each other.

5. The organic light-emitting display apparatus as claimed in claim 1, wherein at least one hole of the plurality of holes has a polygonal shape, a circular shape, or an elliptical shape.

6. The organic light-emitting display apparatus as claimed in claim 1, wherein the holes of the plurality of holes are two-dimensionally arranged.

7. The organic light-emitting display apparatus as claimed in claim 6, wherein holes that are arranged adjacent to each other in a first direction among the plurality of holes are cornerwise arranged.

8. The organic light-emitting display apparatus as claimed in claim 7, wherein partial regions of the holes that are arranged adjacent to each other in the first direction among the plurality of holes are aligned with each other in the first direction, and the other partial regions are not aligned with each other in the first direction.

9. The organic light-emitting display apparatus as claimed in claim 7, wherein the first direction is a length direction of the sealing member.

10. The organic light-emitting display apparatus as claimed in claim 6, wherein some of the plurality of holes do not overlap the sealing member.

11. The organic light-emitting display apparatus as claimed in claim 1, wherein,
the display area includes a transistor, and
the first metal layer is formed of a same material as a material as an electrode of the transistor.

12. The organic light-emitting display apparatus as claimed in claim 11, wherein the first metal layer is formed of the same material as a material of at least one of a source electrode and a drain electrode of the transistor.

13. The organic light-emitting display apparatus as claimed in claim 1, further comprising a first insulating layer between the first substrate and the first metal layer.

14. The organic light-emitting display apparatus as claimed in claim 13, wherein the first insulating layer is formed of a same material as a material of an interlayer insulating layer in the display area.

15. The organic light-emitting display apparatus as claimed in claim 13, further comprising second and third metal layers between the first substrate and the first insulating layer, the second metal layer and the third metal layer being spaced apart from each other.

16. The organic light-emitting display apparatus as claimed in claim 15, further comprising a second insulating layer on the first substrate, the second insulating layer covering the second metal layer,
wherein the first insulating layer is on the second insulating layer and covers the third metal layer.

17. The organic light-emitting display apparatus as claimed in claim 15, wherein a distance between the second metal layer and the third metal layer is less than a longest dimension of at least one of the plurality of holes.

18. The organic light-emitting display apparatus as claimed in claim 15, wherein the second metal layer and the third metal layer are on different layers.

19. A method of manufacturing the organic light-emitting display apparatus as claimed in claim 1, the method comprising:
providing the first substrate that includes the display area and the peripheral area surrounding the display area;
sequentially forming an insulating layer and the first metal layer in the peripheral area;
forming the plurality of holes in the first metal layer; and
bonding the first substrate to the second substrate that corresponds to the first substrate with the sealing member that fills the hole,
wherein at least one hole in the first metal layer includes the first region that underlies the sealing member and the second region that extends from the first region and does not overlap the sealing member.

20. The method as claimed in claim 19, wherein a longest dimension of the hole is greater than a width of the sealing member.

* * * * *